United States Patent
Chang et al.

(10) Patent No.: US 11,205,827 B2
(45) Date of Patent: Dec. 21, 2021

(54) RAPID OVER-THE-AIR PRODUCTION LINE TEST PLATFORM

(71) Applicant: TMY Technology Inc., Taipei (TW)

(72) Inventors: Su-Wei Chang, Taipei (TW);
Chueh-Jen Lin, Taipei (TW);
Wen-Tsai Tsai, Taipei (TW);
Shun-Chung Kuo, Taipei (TW); Yang Tai, Taipei (TW); Wei-Yang Chen, Taipei (TW); Chien-Tse Fang, Taipei (TW); Po-Chia Huang, Taipei (TW); Jiun-Wei Wu, Taipei (TW); Yu-Cheng Lin, Taipei (TW); Shao-Chun Hsu, Taipei (TW)

(73) Assignee: TMY Technology Inc., Taipei (TW)

( * ) Notice: Subject to any disclaimer, the term of this patent is extended or adjusted under 35 U.S.C. 154(b) by 0 days.

(21) Appl. No.: 16/993,348

(22) Filed: Aug. 14, 2020

(65) Prior Publication Data
US 2021/0050923 A1    Feb. 18, 2021

Related U.S. Application Data

(60) Provisional application No. 62/887,815, filed on Aug. 16, 2019.

(51) Int. Cl.
*H01Q 1/22* (2006.01)
*H01Q 13/02* (2006.01)
(Continued)

(52) U.S. Cl.
CPC .......... *H01P 3/088* (2013.01); *H01Q 1/2283* (2013.01); *H01Q 3/2617* (2013.01); *H01Q 13/02* (2013.01);
(Continued)

(58) Field of Classification Search
CPC . H04B 7/02; H04B 7/04; H04B 17/10; H04B 17/15; H04B 17/20; H04B 17/29;
(Continued)

(56) References Cited

U.S. PATENT DOCUMENTS 8,471,774 B2 *   6/2013   Oh ........................ G01R 29/10
                                                    343/703
10,725,080 B2 *  7/2020   Orozco Valdes .. H04B 17/3912
(Continued)

FOREIGN PATENT DOCUMENTS

| CN | 109889239 | 6/2019 |
|---|---|---|
| EP | 3182144 | 6/2017 |

(Continued)

OTHER PUBLICATIONS

Taiwanese Office Action for Taiwanese Patent Application No. 109127363 dated Jan. 29, 2021.
(Continued)

*Primary Examiner* — Blane J Jackson
(74) *Attorney, Agent, or Firm* — JCIPRNET

(57) ABSTRACT

Provided is a rapid over-the-air (OTA) production line test platform, including a device under test (DUT), an antenna array and two reflecting plates. The DUT has a beamforming function. The antenna array is arranged opposite to the DUT, and emits beams with beamforming. Two reflecting plates are disposed opposite to each other, and are arranged between the DUT and the antenna array. The beam OTA test of the DUT is carried out by propagation of the beams between the antenna array, the DUT and the two reflecting plates. Accordingly, the test time can be greatly shortened and the cost of test can be effectively reduced. In addition to the above-mentioned rapid OTA production line test platform, platforms for performing the OTA production line test
(Continued)

by using horn antenna arrays together with bending waveguides and using a 3D elliptic curve are also provided.

8 Claims, 16 Drawing Sheets

(51) Int. Cl.
    *H01P 3/12*     (2006.01)
    *H04B 17/29*     (2015.01)
    *H01P 3/08*     (2006.01)
    *H01Q 3/26*     (2006.01)
    *H01Q 21/00*     (2006.01)
    *H01Q 19/185*     (2006.01)
    *H01Q 21/29*     (2006.01)
    *H04B 17/00*     (2015.01)

(52) U.S. Cl.
    CPC ....... *H01Q 19/185* (2013.01); *H01Q 21/0025* (2013.01); *H01Q 21/293* (2013.01); *H04B 17/0085* (2013.01)

(58) Field of Classification Search
    CPC .. H01P 3/12; H01P 3/088; H01Q 1/12; H01Q 1/22; H01Q 1/2283; H01Q 3/2617; H01Q 13/02; H01Q 19/185
    See application file for complete search history.

(56) References Cited

U.S. PATENT DOCUMENTS

| 10,809,296 | B2* | 10/2020 | Danz | .................... G01R 31/307 |
| 2008/0305754 | A1 | 12/2008 | Foegelle | |
| 2011/0128197 | A1 | 6/2011 | Sakata et al. | |
| 2015/0263815 | A1 | 9/2015 | Bai | |
| 2018/0027434 | A1* | 1/2018 | Foegelle | ............... H04B 7/0617 455/67.13 |
| 2019/0162780 | A1 | 5/2019 | Danz | |
| 2019/0181963 | A1 | 6/2019 | Liang et al. | |

FOREIGN PATENT DOCUMENTS

| RU | 2125275 | 1/1999 |
| TW | 201128983 | 8/2011 |
| TW | I635290 | 9/2018 |
| TW | M571967 | 12/2018 |
| WO | 2017/102980 | 6/2017 |

OTHER PUBLICATIONS

David Reyes, et al., "Over-the-Air Test Method for 5G mmWave Devices with Beamforming Capabilities", 2018 IEEE Globecom Workshops (GC Wkshps), Dec. 9-13, 2018, pp. 1-6.

"Search Report of Europe Counterpart Application", dated Apr. 26, 2021, p. 1-p. 17.

David Reyes et al., "Over-the-Air Test Method for 5G mmWave Device with Beamforming Capabilities", 2018 IEEE Globecom Workshops, Dec. 9, 2018, pp. 1-7.

"Office Action of Japan Counterpart Application", dated Oct. 12, 2021, p. 1-p. 5.

* cited by examiner

FIG. 7

RAPID OVER-THE-AIR PRODUCTION LINE TEST PLATFORM

BACKGROUND

1. Technical Field

The present disclosure generally relates to production line test platforms. More specifically, the present disclosure relates to rapid millimeter wave (mmWave) fifth generation (5G) mobile communication over-the-air (OTA) production line test platforms.

2. Description of Related Art

The maturing of the fifth generation (5G) mobile communication technology has critically influenced in various application, such as vehicle-to-everything (V2X), edge computing, artificial intelligence of things (AIoT) in the next generation mobile communication technology. 5G New Radio (5G NR) has re-defined a new frequency spectrum under the following three circumstances: enhanced Mobile Broadband (eMBB), Ultra-Reliable and Low Latency Communications (URLLC) and massive Machine Type Communications (mMTC). Frequency Range 2 (FR2) uses millimeter waves (mmWave) with frequencies range from 24250 MHz to 52600 MHz in 3GPP standard. In order to overcome high path loss during signal transmission, beamforming technique has been employed in antenna arrays to achieve higher equivalent isotropically radiated power (EIRP) and wider coverage.

Nowadays, antenna arrays can be integrated into RF modules. Such a high density module is called an Antennas in Package (AiP) module and can be mass produced. For mass-produced AiP modules, conventional conductivity tests are not capable of testing of large amounts of products and conducting fast product testing.

Moreover, during product testing, traditional mechanical turntables have relatively slow testing speeds if high precision is required. On the other hand, if fast testing is needed, then precision may be compromised. If both high precision and fast testing are demanded, then the mechanical motors used will be considerably more expensive. As such, in the case of mass-produced products, traditional mechanical testing is not suitable for mass production testing.

Therefore, there is a need in the art for a low-cost, high-performance rapid production line test platform to address the aforementioned shortcomings.

SUMMARY

The present disclosure provides a rapid over-the-air (OTA) production line test platform, which may include: an antenna array for transmitting a test beam in a plurality of transmitting directions; an electromagnetic wave guiding device for guiding the test beam; a test machine to be loaded with a device under test (DUT) for controlling the DUT to receive the guided test beam from a plurality of receiving directions; and a controller electrically connected with the test machine and the antenna array for calculating an antenna radiation pattern of the DUT based on at least one power received from the plurality of receiving directions corresponding to the DUT and a transmitting power of the antenna array.

In an embodiment, the rapid OTA production line test platform may further include: two reflecting plates disposed opposite to each other and between the DUT and the antenna array, wherein the test beam propagates between the antenna array, the DUT and the two reflecting plates to enable an OTA beam test of the DUT.

In an embodiment, the rapid OTA production line test platform may further include a first horn antenna array and a second horn antenna array arranged and focus around a first center and a second center, respectively; and a plurality of bending waveguides connected between the first horn antenna array and the second horn antenna array, wherein the antenna array at the first center sequentially transmits the test beam with beamforming towards the first horn antenna array, and the DUT capable of beamforming at the second center receives the test beam after being guided by the plurality of bending waveguides to implement the OTA beam test of the DUT.

In an embodiment, the rapid OTA production line test platform may further include a three dimensional (3D) elliptic curve, wherein a plane of the antenna array and a plane of the DUT capable of beamforming are perpendicular to each other, and the test beam is transmitted with beamforming by the antenna array at a first focal point of the 3D elliptic curve, then reflected by the 3D elliptic curve and received by the DUT at a second focal point of the 3D elliptic curve to implement the OTA beam test of the DUT.

BRIEF DESCRIPTION OF THE DRAWINGS

FIG. 7 is a quantitative diagram of a S21 power level scan (using 9×9 horn antenna array as an example).

DETAILED DESCRIPTION

Embodiments of the present disclosure are explained with specific implementations. The advantages and technical effects of the present disclosure can be readily understood by one with ordinary skill in the art upon reading the disclosure provided herein, and can be used or applied in different implementations.

In order to address the shortcomings in the prior art, an objective of the present disclosure is to provide a rapid over-the-air (OTA) production line test platform applicable to millimeter wave (mmWave) fifth generation (5G) mobile communication. Embodiments of the present disclosure are described below.

Figure 1:
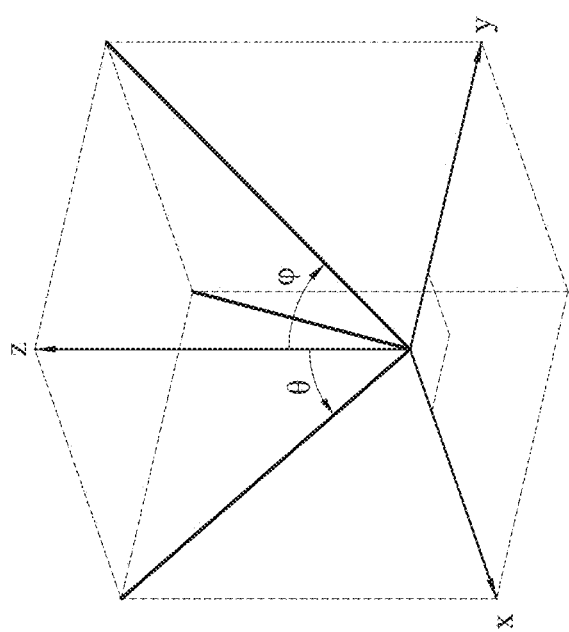
FIG. 1 is a schematic diagram depicting transmission and receiving by an antenna array.

Referring to FIG. 1, a schematic diagram depicting a directional electromagnetic wave transmitted or received by an antenna array is shown. In various embodiments of the present disclosure, a first component angle $\theta$ is the angle of the projection of a transmitting vector on a xz plane with respect to the normal direction (z axis), and a second component angle $\varphi$ is the angle of the projection of the transmitting direction of the electromagnetic wave on a yz plane with respect to the normal direction (z axis).

Figure 2B:
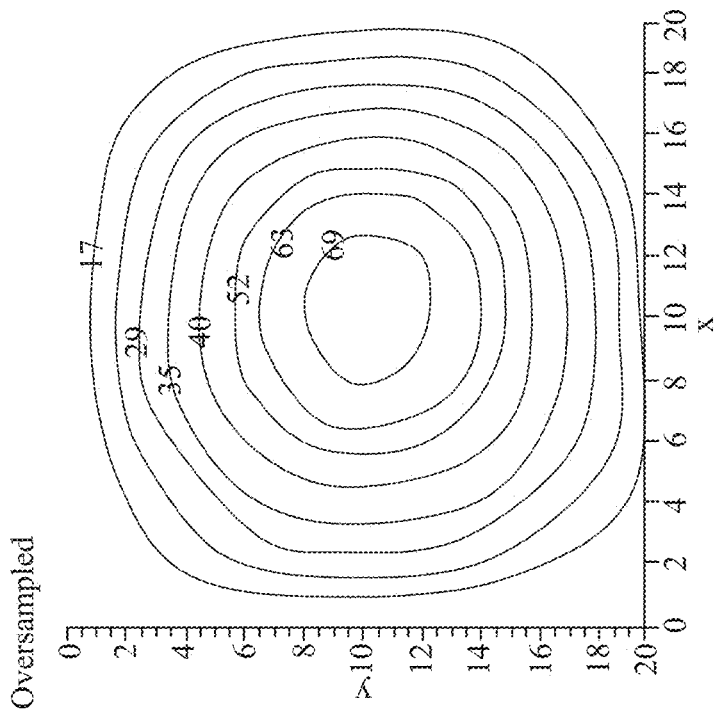
FIG. 2B is a schematic contour map depicting strengths of a power level scan (oversampled).
Figure 2A:
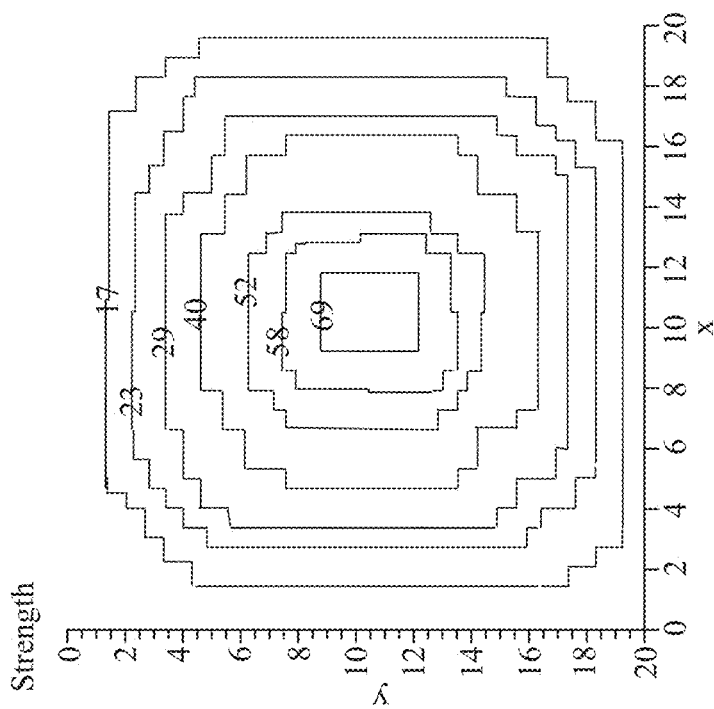
FIG. 2A is a schematic contour map depicting strengths of a power level scan.
Figure 3D:
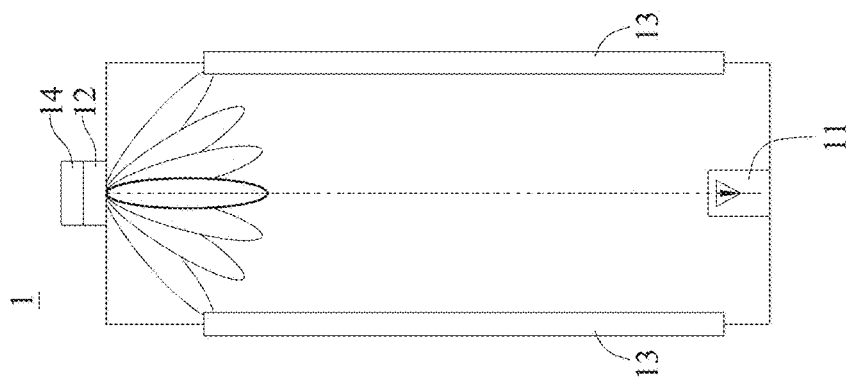
FIGS. 3A to 3D are schematic diagrams depicting a rapid OTA production line test platform in accordance with a first embodiment of the present disclosure.
Figure 3C:
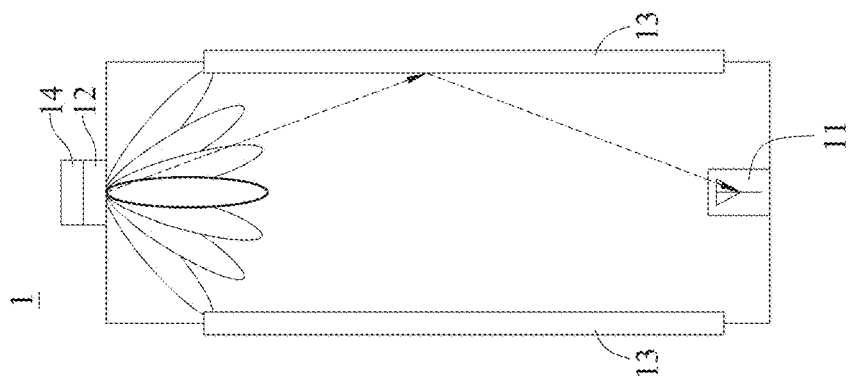
Figure 3B:
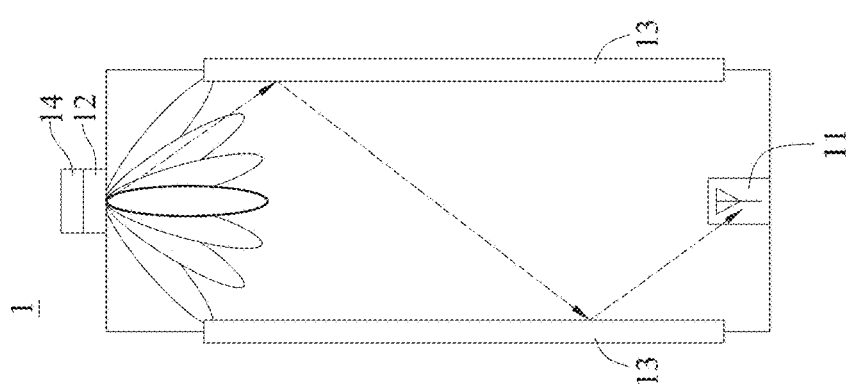
Figure 3A:
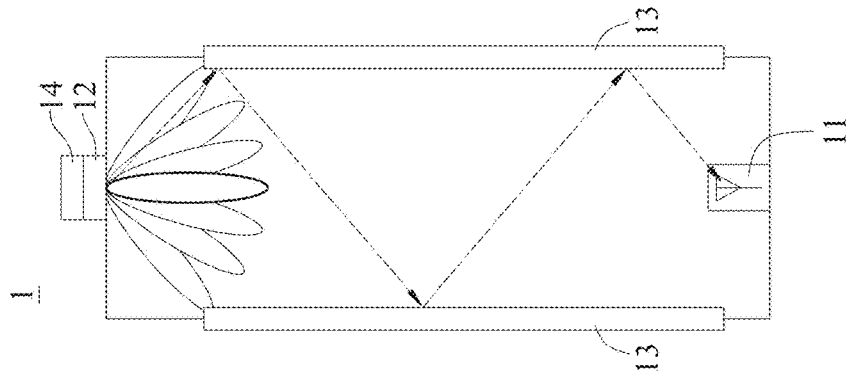

First, it should be noted that in the embodiments of the present disclosure, the signal strength of a signal source (i.e., transmitting end) is represented as $P_S$, which varies with the first component angle $\theta$ and the second component angle $\varphi$. As shown by contour maps depicting a power level scan of signals passing through a device under test (DUT) in FIGS. 2A and 2B, the contour lines are not perfect circles, but rather the strengths of the transmitting signals may vary slightly with differences in the two component angles. This is a characteristic of antenna arrays. As such, the signal strength of a signal source can be represented as $P_S(\theta, \varphi)$, and the path loss can be represented as $P_L$. Since the path loss is a function of the path length R, path loss can be essentially represented as $P_L(R)$. The noise signal strength at the receiving end (i.e., the DUT) can be represented as $P_N$, which is typically set as a constant for the same DUT. In other words, during the same measurement, the noise signal strength is usually frequency-specific and the environment is assumed to be unchanged (in practice, however, the noise signal strength may still vary with frequency and the environment). In addition, since the gain at the receiving end varies with the first component angle $\theta$ and the second component angle $\varphi$ of the directional receiving angle (similar to the signal strength of the signal source), the gain at the receiving end can be expressed as $G_R(\theta, \varphi)$, and the signal-to-noise ratio (SNR) received by the receiving end can be described by the following equation (1):

$$SNR(\theta, \varphi) = \frac{P_s(\theta, \varphi) P_L G_R(\theta, \varphi)}{P_N} \quad (1)$$

As can be seen from the equation (1) above, all of the variables are known except for the gain $G_R(\theta, \varphi)$ at the receiving end. Thus, based on the SNR and the path loss $P_L$ received by the receiving end and/or the signal strength of the signal source $P_S(\theta, \varphi)$, and optionally, the noise signal strength $P_N$ at the receiving end, the gain $G_R(\theta, \varphi)$ at the receiving end can be obtained by measurement and calculation. The antenna radiation pattern of the DUT can then be obtained by a quantitative grid chart of a power level scan. In some applications, the energy can be computed directly. In some embodiments, in the case that the DUT is an antenna array instead of a single antenna and the signal source is also an antenna array, the signal source emits mmWave to the DUT with a first component angle $\theta_m$ and a second component angle $\varphi_n$, then the DUT will also need to correspondingly switch to $\theta_m$ and $\varphi_n$, i.e., $(\theta_m, \varphi_n)$. In some other embodiments, in the case that the DUT is an antenna array, the signal source emits mmWave to the DUT with a first component angle $\theta_m$ and a second component angle $\varphi_n$, then the DUT will also need to correspondingly switch to $\theta_x$ and $\varphi_y$, i.e., $(\theta_x, \varphi_y)$, wherein x is m−2~m+2, and y is n−2~n+2, but the present disclosure is not limited as such. In the embodiments of the present disclosure described below, the SNRs received by the receiving ends can all be obtained by measurement and calculation (as mentioned above) in order to obtain the antenna radiation patterns of the DUTs via quantitative grid charts of a power level scan. In some other embodiments, the signal strength received by the DUT can be calculated directly and the antenna radiation pattern can be obtained using the equation (1) above. Moreover, it can be appreciated by those of ordinary skill in the art that measuring and calculating the signal strength (power) received by the receiving end is substantially equivalent to the method realized using the SNR above.

In the following embodiments, the notion of determining an antenna radiation pattern of a DUT from multiple directions is realized by an antenna array of known characteristics and an electromagnetic wave guiding device.

In the various embodiments of the present disclosure, the antenna array emits test beams in a plurality of transmitting directions, and the electromagnetic wave guiding device guides the test beams. A DUT is loaded on a test machine and controlled to receive the guided test beams from a plurality of receiving directions. A controller is electrically connected with the test machine and the antenna array for calculating the antenna radiation pattern of the DUT based on at least on the power received by the DUT at the plurality of receiving directions as well as the transmission power of the antenna array.

First Embodiment

FIGS. 3A to 3D are schematic diagrams depicting a rapid OTA production line test platform 1 in accordance with an embodiment of the present disclosure. The rapid OTA production line test platform 1 of the present disclosure for testing a device under test (DUT) 11 includes an antenna array 12, two reflecting plates 13 and a beamforming circuit 14. In an embodiment, the electromagnetic wave guiding device substantially includes at least the two reflecting plates 13 above.

In the embodiments of the present disclosure, the DUT 11 includes a beamforming function. The antenna array 12 is disposed opposite to the DUT 11 and emits test beams using a beamforming technique. The two reflecting plates 13 are disposed opposite to each other and between the DUT 11 and the antenna array 12. The OTA beam testing of the DUT 11 is conducted on beams reflected by the reflecting plates 13 at either side.

Figure 4:
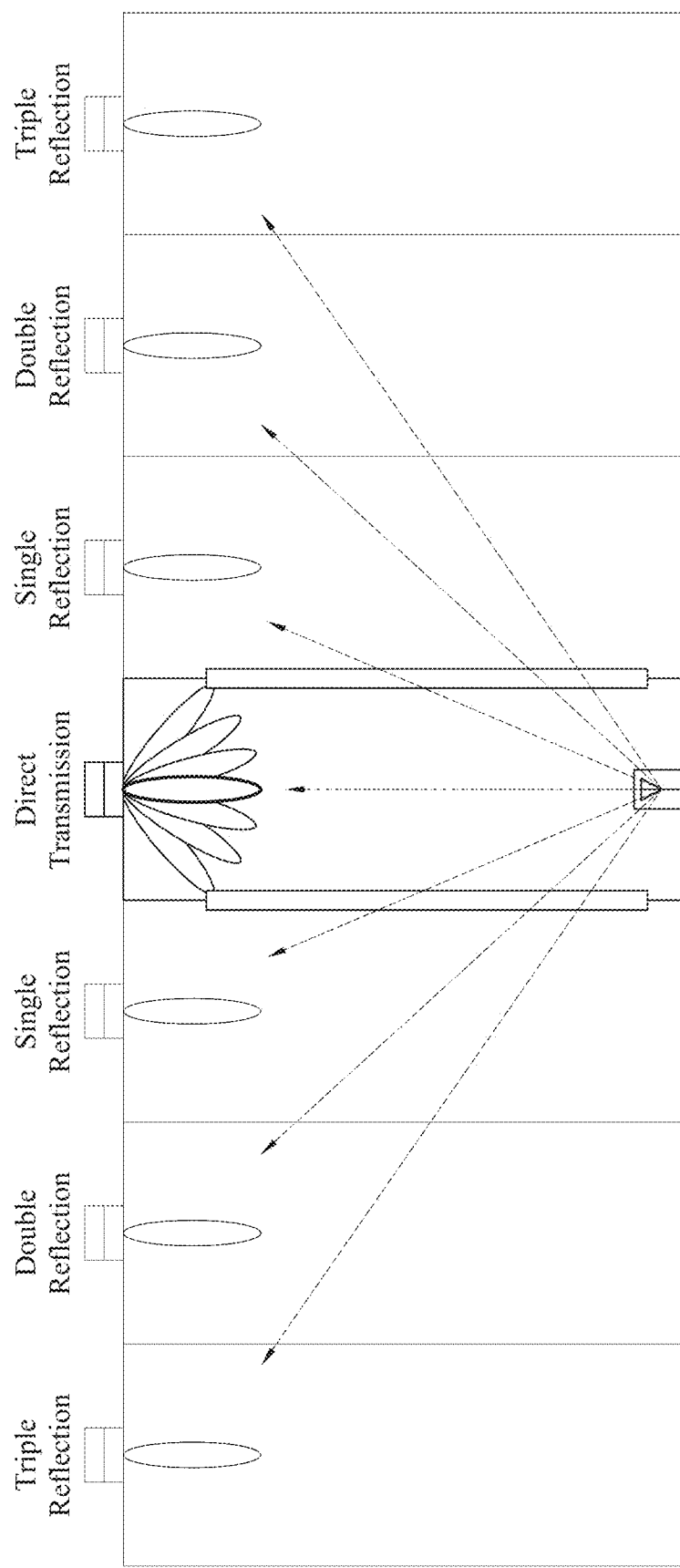
FIG. 4 is a schematic diagram illustrating seven different sets of angles that can be tested in the rapid OTA production line test platform of the first embodiment of the present disclosure.

The antenna array 12 is capable of beamforming, and the reflecting plates 13 at the two sides allows different beam directions of the DUT to be tested according to the needs. As shown in FIGS. 3A-3D, in an embodiment of the present disclosure, through direct transmission, single reflection, double reflections and triple reflections, 7 different sets of angles can be tested as can be seen in FIG. 4. In some implementations, the path lengths of the present embodiment are related to the two component angles, so the path loss in this embodiment can be expressed as $P_L(\theta, \varphi)$. Thus, in this embodiment, the gain of the DUT 11 (i.e., the receiving end) at a specific receiving angle can be obtained based on the received SNR (or power) and other known parameters by measurements and calculations using the above equation (1), and data at various receiving angles can be collected to obtain the antenna radiation pattern of the DUT 11.

In addition, it should be noted that the beamforming circuit 14 of the present disclosure can be connected to the antenna array 12. Since the beamforming circuit 14 includes a beamforming electronic scanning probe capable of 2D plane scan. Based on the requirements of the OTA tests, the beamforming circuit 14 can be connected to a network analyzer, signal generator, signal analyzer or a baseband equipment to perform other types of tests. Moreover, depending on the frequency band of the test equipment, an up/down frequency circuit with up/down frequency function can be added if needed.

Second Embodiment

Figure 5:
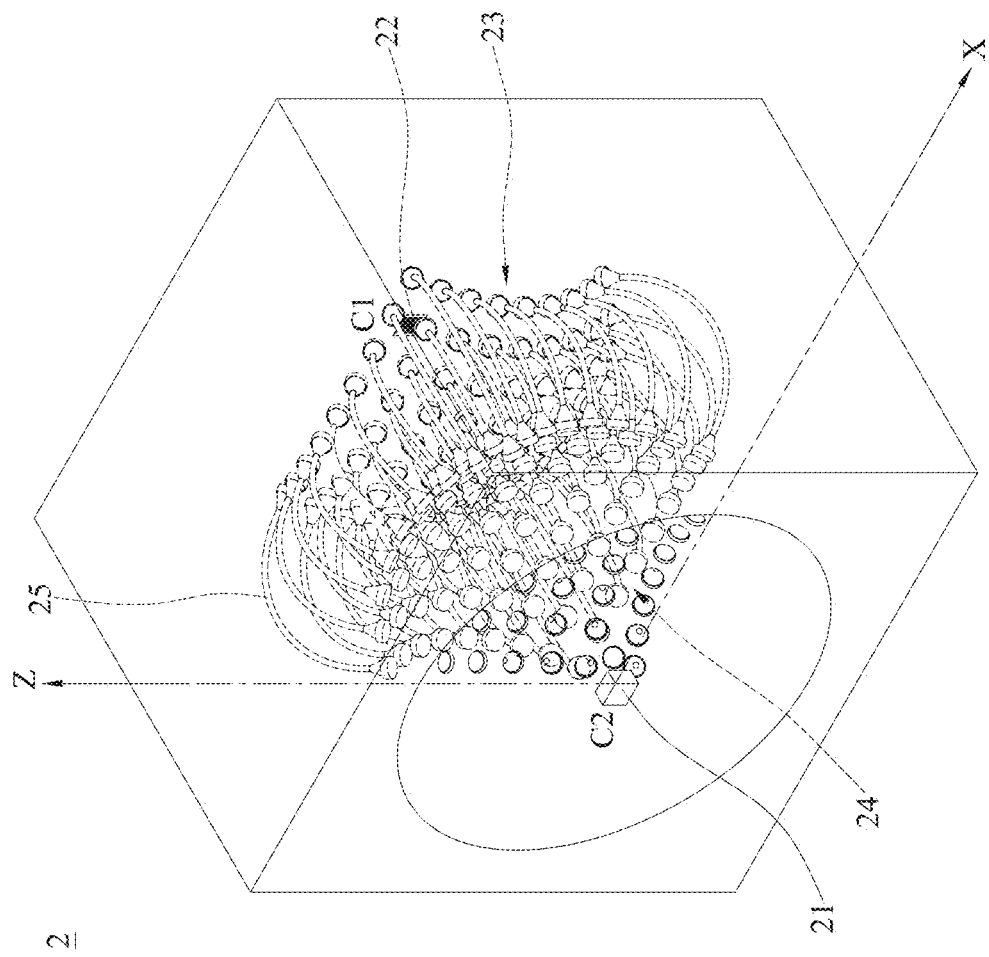
FIG. 5 is a schematic perspective view of a rapid OTA production line test platform in accordance with a second embodiment of the present disclosure.
Figure 6:
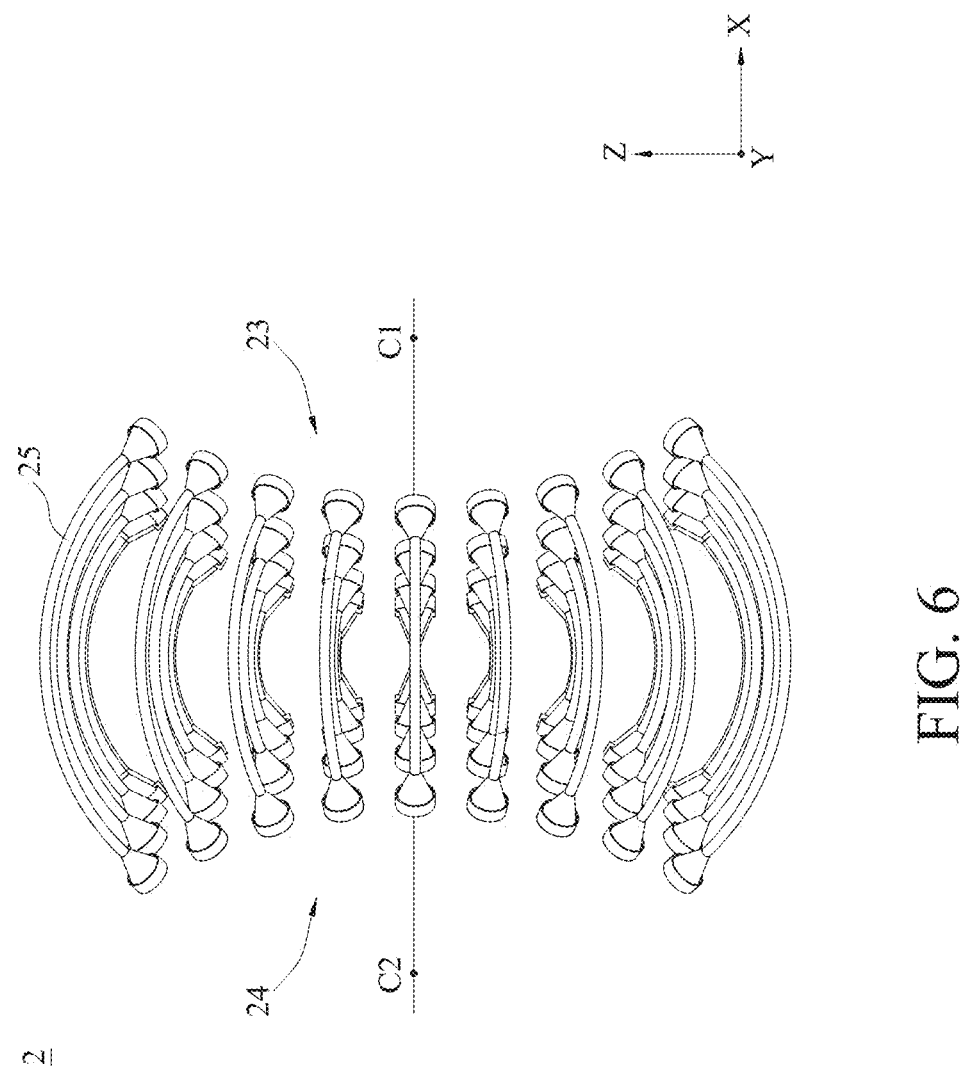
FIG. 6 is a schematic side view of a rapid OTA production line test platform in accordance with the second embodiment of the present disclosure.

Referring to FIGS. 5 and 6, schematic diagrams of a rapid OTA production line test platform 2 in accordance with an embodiment of present disclosure are shown. The rapid OTA production line test platform 2 of the present disclosure for testing a DUT 21 includes an antenna array 22, a first horn antenna array 23 a second horn antenna array 24 and a plurality of bending waveguides 25. In an embodiment, the electromagnetic wave guiding device substantially includes at least the first horn antenna array 23, the second horn antenna array 24 and the plurality of bending waveguides 25.

In an embodiment, the DUT 21 is similarly capable of beamforming. The first horn antenna array 23 and the second horn antenna array 24 are arranged and focused around a first center C1 and a second center C2, respectively. The plurality of bending waveguides 25 are connected between the first horn antenna array 23 and the second horn antenna array 24. As such, the antenna array 22 at the first center C1 sequentially emits signals towards the first horn antenna array 23, and the DUT 21 receives at the second center C2, so as to conduct OTA beam testing of the DUT 21.

As shown in FIGS. 5 and 6, in contrast to a conventional darkroom radiation pattern test, the first horn antenna array 23 and the second horn antenna array 24 of the present disclosure being arranged and focused around the two centers (i.e., the first center C1 and the second center C2) allows the antenna array 22 at the first center C1 to emit signals by beamforming techniques and the DUT 21 at the second center C2 (the other center) to beamformingly receive the signals through the first horn antenna array 23 and the second horn antenna array 24 coupled with the plurality of bending waveguides 25. Needless to say, the antenna array 22 acting as a transmitting end at the first center C1 can also be a receiving end, while the DUT 21 acting as a receiving end at the second center C2 can be a transmitting end. Therefore, transmitting and receiving radiation patterns can be measured.

In addition, the resolution of the first horn antenna array 23 and the second horn antenna array 24 depends on the number of horn antennae in the first horn antenna array 23 and the second horn antenna array 24, the intervals between the horn antennae, and the distance between the DUT 21 and the first horn antenna array 23 and the second horn antenna array 24 as well as the distance between the antenna array 22 and the first horn antenna array 23 and the second horn antenna array 24. It should be noted that, in this embodiment, the plurality of bending waveguides 25 are used instead of the reflecting plates to guide the beamforming from the transmitting interface to the receiving interface at defined angles in order to obtain the measurements of beam peak power level and the phase.

Figure 7:
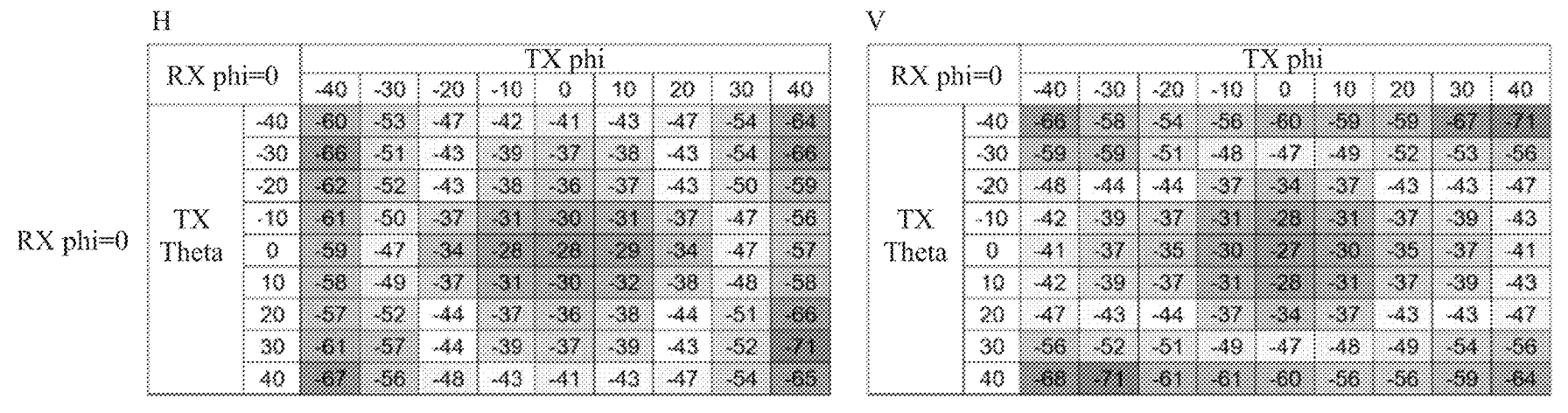

In addition, it should be noted that, in this embodiment, the path lengths in this embodiment are the path lengths of free space, i.e., the distance from the antenna array 22 of the transmitting end to the first horn antenna array 23 and the distance from the DUT 21 to the second horn antenna array 24. The plurality of bending waveguides 25 are assumed to have no path loss, so the path loss of the present embodiment can be set as a constant. As such, the gain of the DUT 21 (i.e., the receiving end) at specific receiving angle and rotational direction can be obtained based on the received SNR (or power) and other known parameters by measurements and calculations using the equation (1) above, and then the antenna radiation pattern of the DUT 21 can be obtained through a quantitative grid chart of a power level scan (as shown in FIG. 7). However, in the case that the plurality of bending waveguides 25 are assumed to have path loss (as waveguides at different angles may have slightly different lengths), then the path lengths in this embodiment can be represented by $P_L(\theta, \varphi)$.

In an embodiment, if the path lengths of free space (i.e., the distance from the antenna array 22 of the transmitting end to the first horn antenna array 23 and the distance from the DUT 21 to the second horn antenna array 24) are less than the respective far-field distance of the antenna array 22 and the far-field distance of the DUT 21, then a compensation model needs to be introduced.

FIG. 7 is a quantitative diagram depicting a power level scan of a S21 signal passing through a DUT (using 9×9 horn antenna arrays as an example). The transmitting end at the first center C1 sequentially transmits directional beamforming towards the 9×9 horn antenna arrays, and the receiving end at the second center C2 receives the beams at 0 degree of a fixed boresight along the positive Y axis. As can be seen from FIG. 7, the power level is at maximum when phi (i.e., $\varphi$)=0 and theta (i.e., $\theta$)=0, and beamforming product testing can be realized under both horizontal polarization (shown by the left chart labeled as H in FIG. 7) and vertical polarization (shown by the right chart labeled as V in FIG. 7).

Figure 8:
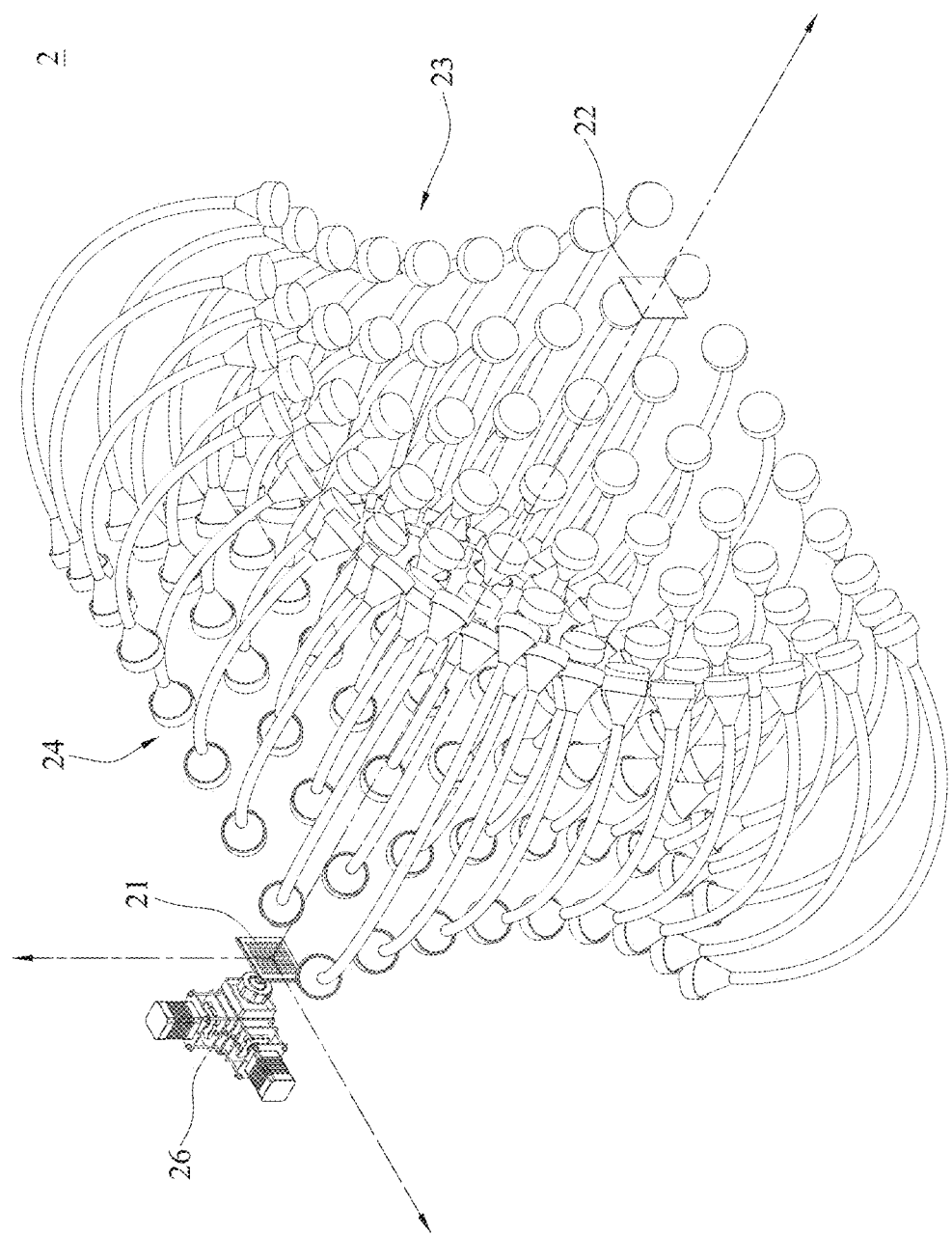
FIG. 8 is a schematic perspective view of the rapid OTA production line test platform including a rotary motor in accordance with the second embodiment of the present disclosure.

As shown in FIG. 8, the present embodiment further includes a rotary motor 26 for rotating the DUT 21, thereby increasing the flexibility of its application.

In addition, the present embodiment further includes a beamforming circuit (not shown) that can be connected to the antenna array 22.

Figure 9A:
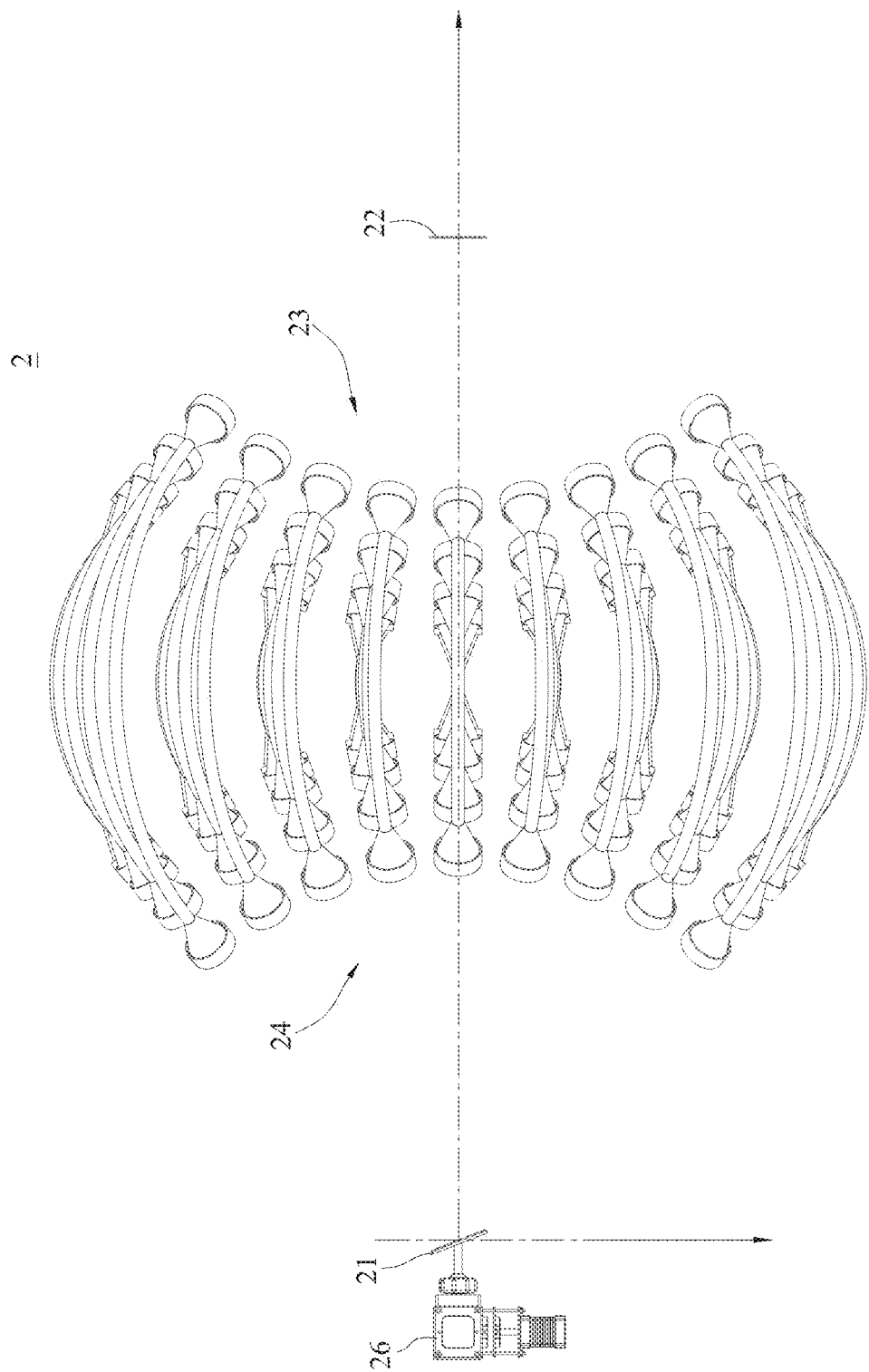
FIG. 9A is a schematic side view of a DUT rotated an angle in the rapid OTA production line test platform in accordance with the second embodiment of the present disclosure.
Figure 9B:
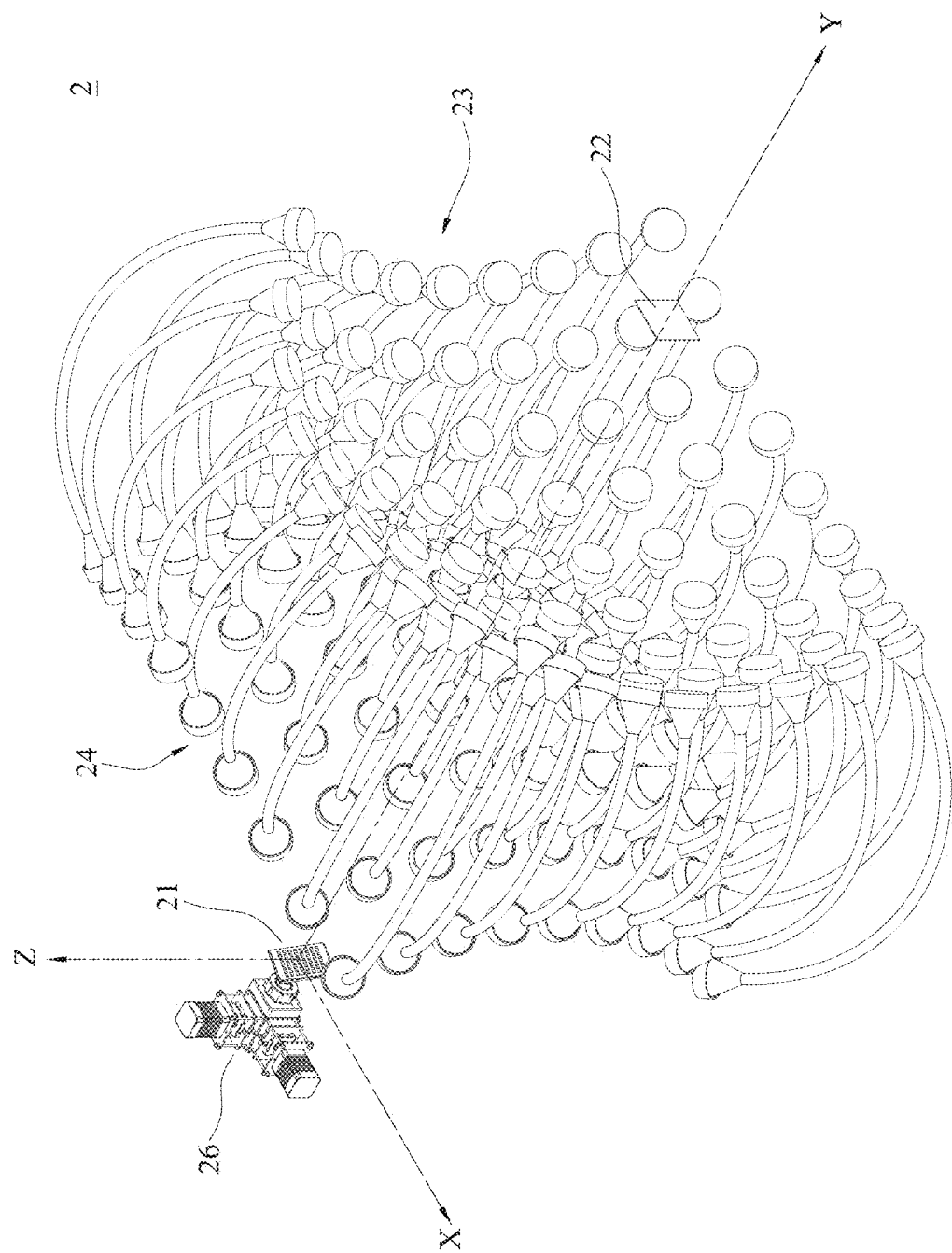
FIG. 9B is a schematic perspective view of a DUT rotated an angle in the rapid OTA production line test platform in accordance with the second embodiment of the present disclosure.

FIGS. 9A and 9B are schematic diagrams depicting a rotatable DUT 21. If the beam width of the DUT 21 is resolution×n+m (where n is an integer greater than or equal to 0, 0<m<resolution, and m is an integer), then the DUT 21 can be made to direct its beams to the boresight of the transmitting end or at an angle that is an integer multiple of the resolution through the rotary motor 26 (e.g., such that the beams pointing to the opposite direction) to carry out measurements using the present embodiment. For example, the directionality of the beams of the DUT 21 is −9 degrees rotation in the X-axis and −9 degrees rotation in the Z-axis, the rotary motor 26 can rotate the antenna plane of the DUT 21 in the opposite direction to +9 degrees rotation in the X-axis and +9 degrees rotation in the Z-axis.

Simply put, the present embodiment employs horn antenna arrays arranged in circles combined with bending waveguides, such that the transmitting end and the receiving end can simultaneously perform 3D beamforming measurements. The present embodiment effectively reduces the time for beamforming verification and measurement, that is, by simply multiplying the beam switching time by the number of angle points required. Moreover, the present embodiment requires only the use of bending waveguides and horn antenna arrays without the need for reflective planes or complex mechanical components, thereby effectively reducing the cost of measurement.

Third Embodiment

Figure 10:
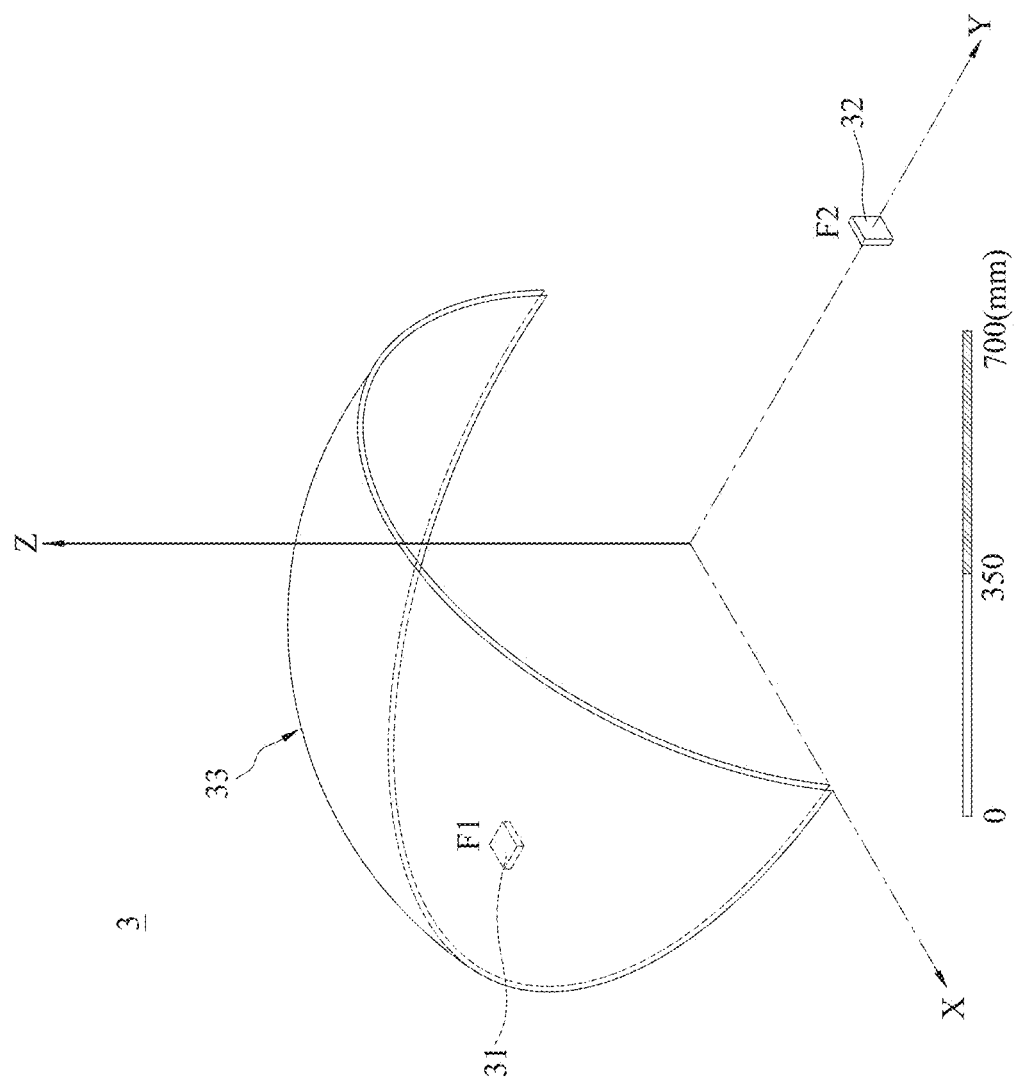
FIG. 10 is a schematic perspective view of a rapid OTA production line test platform in accordance with a third embodiment of the present disclosure.

FIG. 10 is a schematic diagram of a rapid OTA production line test platform 3 in accordance with an embodiment of present disclosure. The rapid OTA production line test platform 3 of the present disclosure for testing a DUT 31 includes an antenna array 32 and a 3D elliptic curve 33. The DUT 31 is capable of beamforming. The plane of the DUT 31 is perpendicular to the plane of the antenna array 32. The antenna array 32 is disposed at a second focal point F2 of the 3D elliptic curve 33 and emits beams by beamforming techniques, while the DUT 31 receives signals at a first focal point F1 of the 3D elliptic curve 33 through single reflection, such that OTA test of the DUT 31 can be achieved. In an embodiment, the electromagnetic wave guiding device described before substantially includes at least the 3D elliptic curve 33.

In other words, based on the characteristic of two focal points (i.e., the first focal point F1 and the second focal point F2) in the 3D elliptic curve equation, the present embodiment allows the antenna array 32 (i.e., the transmitting end) at the second focal point F2 to emit signals by beamforming techniques, and the DUT 31 at the other focal point (i.e., the first focal point F1) to receive the signals by beamforming techniques through single reflection, wherein the reflection angle can be computed from the incident angle and the 3D elliptic curve equation. Of course, the transmitting end at the second focal point F2 can also be used as a receiving end, while the receiving end at the first focal point F1 can be used as a transmitting end. Therefore, transmitting and receiving radiation patterns can be measured. In addition, it should be noted that, in this embodiment, owing to the characteristic of the elliptic curve of the present embodiment, the path lengths in this embodiment are all the same, and can thus be set as a constant. As such, the gain of the DUT 31 at specific receiving angle and rotational direction can be obtained based on the received SNR (or power) and other known parameters by measurements and calculations using the equation (1) above, and the antenna radiation pattern of the DUT 31 can then be obtained through a quantitative grid chart of a power level scan. However, if the reflective curve characteristic is taken into consideration, then the path lengths in this embodiment can be expressed as $P_L(\theta, \varphi)$.

It should be noted that, in this embodiment, the plane of the DUT 31 and the plane of the antenna array 32 are perpendicular to each other, so the plane of the DUT 31 vertical to the plane of the transmitting end allows the beamforming coverage area to be effectively utilized.

In addition, the present embodiment further includes a beamforming circuit (not shown) that can be connected to the antenna array 32.

As shown in FIG. 10, as an example, the ratio of the long axis a to the short axis b of the 3D elliptic curve 33 is 1.3, and a 3D elliptic curve 33 with ¼ of an area is used, the transmitting end and the receiving end can simultaneously perform beamforming measurements. Thus, the present embodiment effective shortens the beamforming verification and measurement time. Moreover, the measurable angle of the 3D elliptic curve 33 with ¼ of an area is 90−arc(sin(b/a))=39.7 degrees. It should be noted that, in this embodiment, in addition to using a 3D elliptic curve 33 with ¼ of an area, the 3D elliptic curve 33 may also be a 3D elliptic reflective surface with ⅛ or other fractions of an area.

Figure 11A:
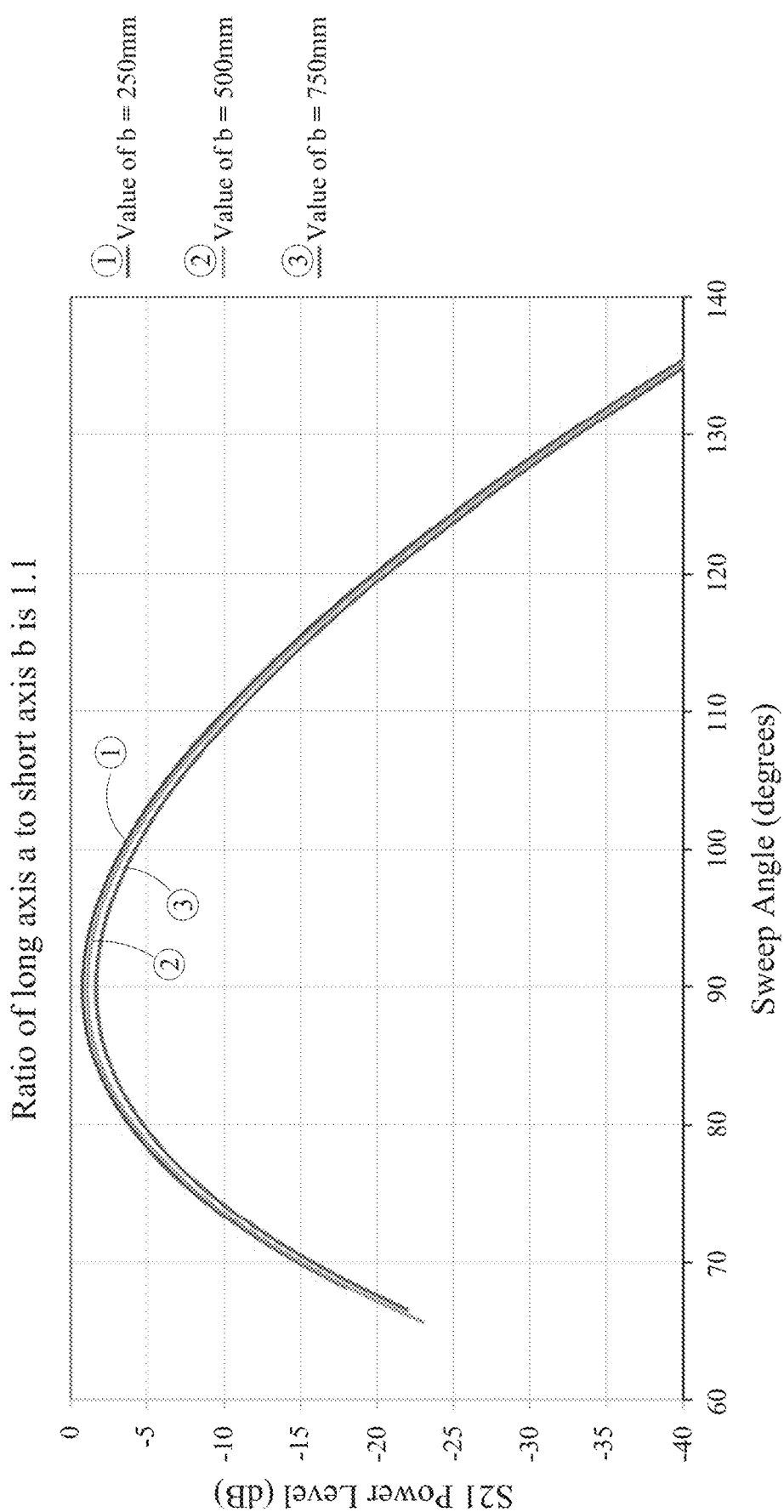
FIG. 11A is a graph depicting the simulation result of a S21 power level scan (assuming 3D elliptic curve has ¼ of an area, the ratio of a long axis a to a short axis b being 1.1, and the value of b being 250 mm, 500 mm, and 750 mm).

In addition, it should be noted that, in the embodiments of the present disclosure, if the 3D elliptic curve is extended along the Y-axis, then the range of measurement angles can be increased. If the DUT 31 lies flat on the X-Y plane (horizontal plane), then the blockage effect can be minimized FIG. 11A is the simulation result of a S21 power level scan (assuming 3D elliptic curve has ¼ of an area, the ratio of the long axis a to the short axis b is 1.1, and the value of b is 250 mm, 500 mm, and 750 mm). As can be seen from the simulation result set forth in FIG. 11A, given that the ratios of the long axis a to the short axis b are unchanged, similar reflection characteristic can be obtained with different values of b.

Figure 11B:
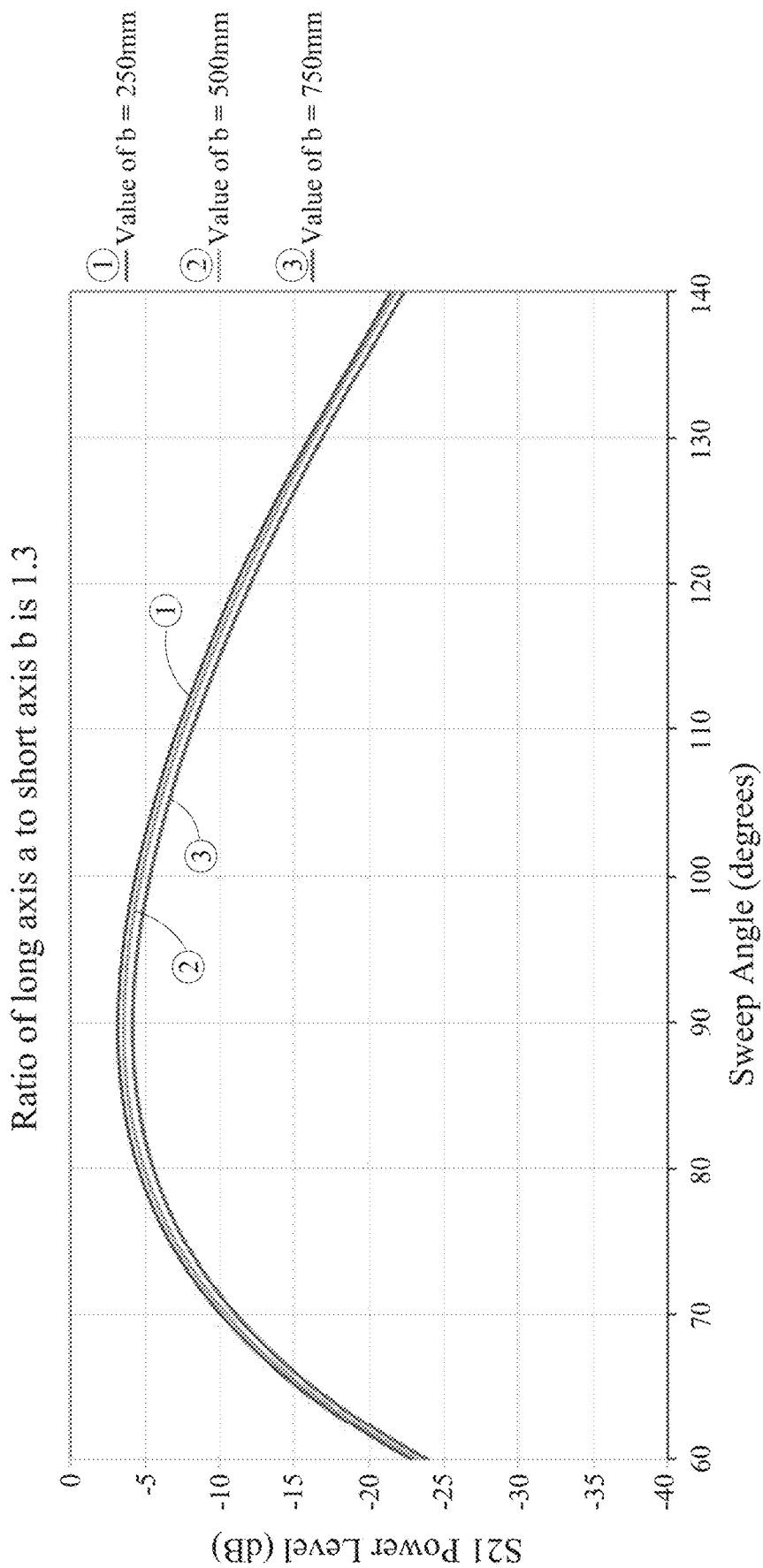
FIG. 11B is a graph depicting the simulation result of a S21 power level scan (assuming 3D elliptic curve has ¼ of an area, a ratio of a long axis a to a short axis b being 1.3, and the value of b being 250 mm, 500 mm, and 750 mm).

FIG. 11B is the simulation result of a S21 power level scan (assuming 3D elliptic curve has ¼ of an area, the ratio of the long axis a to the short axis b is 1.3, and the value of b is 250 mm, 500 mm, and 750 mm). As can be seen from the simulation result set forth in FIG. 11B, given that the ratios of the long axis a to the short axis b are unchanged, similar reflection characteristic can still be obtained with different values of b. FIGS. 11A and 11B indicate power levels received by the DUT at a fixed angle of 90 degrees at the first focal point F1 scanned by beams at different incident angles (i.e., different sweep angles) from the second focal point F2.

Figure 12A:
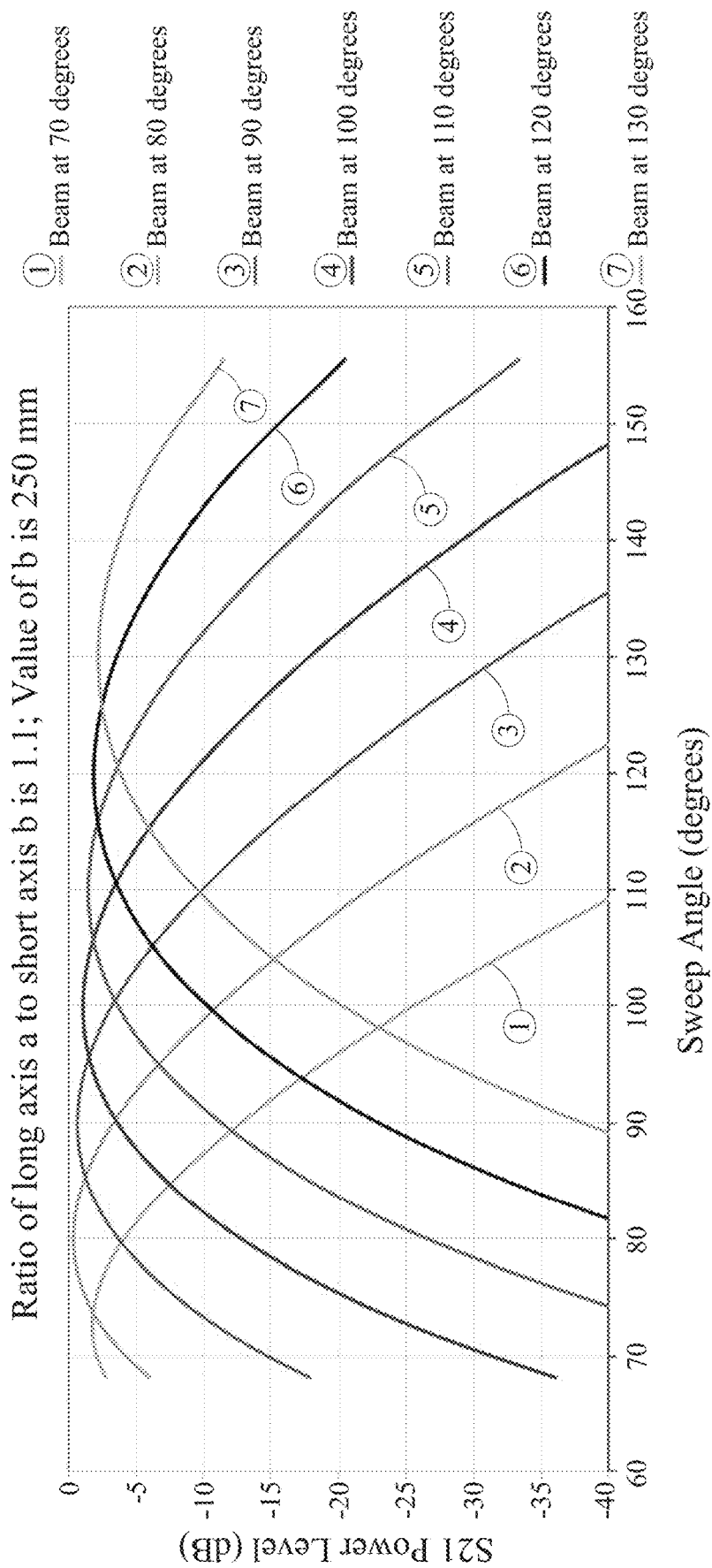
FIG. 12A is a graph depicting the simulation result of a S21 power level scan (assuming 3D elliptic curve has ¼ of an area, the ratio of a long axis a to a short axis b being 1.1, and the value of b being 250 mm).

FIG. 12A is the simulation result of a S21 power level scan (assuming 3D elliptic curve has ¼ of an area, the ratio of the long axis a to the short axis b is 1.1, and the value of b is 250 mm). As can be seen from the simulation result of FIG. 12A, the angle of the power peak of the DUT is the transmitting angle at the originating focal point.

Figure 12B:
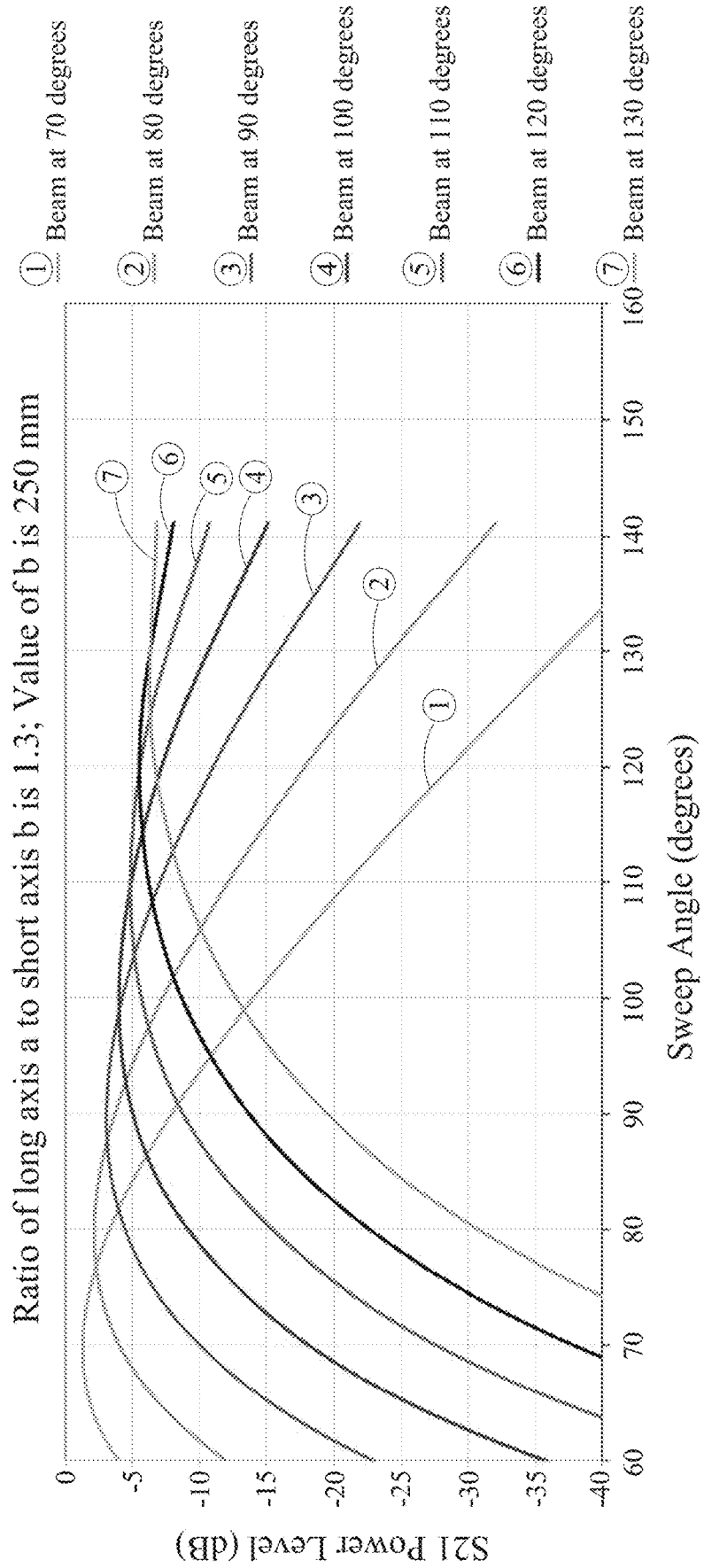
FIG. 12B is a graph depicting the simulation result of a S21 power level scan (assuming 3D elliptic curve has ¼ of an area, a ratio of a long axis a to a short axis b being 1.3, and the value of b being 250 mm).

FIG. 12B is the simulation result of a S21 power level scan (assuming 3D elliptic curve has ¼ of an area, the ratio of the long axis a to the short axis b is 1.3, and the value of b is 250 mm). As can be seen from the simulation result of FIG. 12B, the angle of the power peak of the DUT is the transmitting angle at the originating focal point. FIGS. 12A and 12B indicate power levels received by the DUT at different beam angles (i.e., DUT sweep angles) at the first focal point F1 scanned by beams from the second focal point F2.

Figure 13:
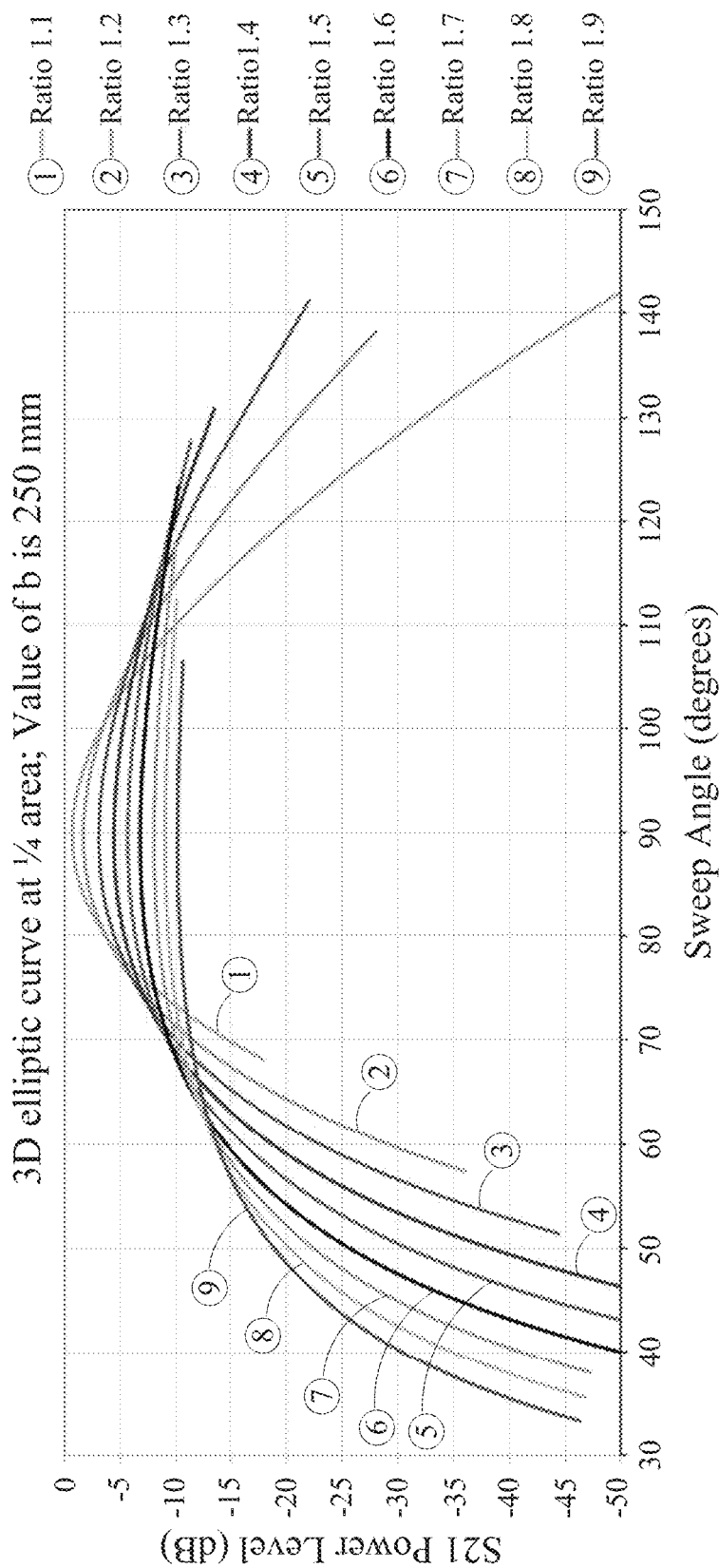
FIG. 13 is a graph depicting the simulation result of a S21 power level scan (assuming 3D elliptic curve has ¼ of an area, and the value of b fixed at 250 mm).

FIG. 13 is the simulation result of a S21 power level scan (assuming 3D elliptic curve has ¼ of an area and the value of b is 250 mm). As can be seen from the simulation result of FIG. 13, different scan coverages resulted from different ratios (i.e., the ratio of long axis a to the short axis b); the larger the ratio, the lower the angle recognition rate; and on the other hand, the smaller the ratio, the higher the angle recognition rate. Thus, if ratios 1.1 to 1.5 are used and a wider reflection range is obtained by increasing the curvature, then different application needs can be met.

Simply put, by utilizing the characteristic of two focal points of a 3D elliptic equation, the present embodiment is able to realize rapid OTA testing through 3D elliptic curves or piecewise curves without the need for reflecting plates or complex mechanical components, thereby effectively reducing the cost of measurement.

In conclusion, the various embodiments of the present disclosure described above includes the beamforming electronic probe for electronic scanning and reflective planes for DUT testing at different angles. As electronic scanning is used by the present disclosure, it has significant improvements over the conventional mechanical scanning in terms of speed and precision. Moreover, since electronic probe is used in the present disclosure, there is the possibility for automated testing in overall OTA system integration.

The embodiments above are provided to illustrate the technical principles, features and technical effects of the present disclosure, and are not to be construed as to limit the scope of the present disclosure. It should be readily appreciated by one of ordinary skill in the art that modifications and variations can be made to the embodiments disclosed herein without departing from the spirit and scope of the present disclosure. Any equivalent modifications and variations made in light of the teachings disclosed herein should be considered as fall within the scope of the appended claims. The scope of the present disclosure sought to be protected is set forth in the appended claims.

What is claimed is:

1. A rapid over-the-air (OTA) production line test platform, comprising:
    an antenna array for transmitting a test beam in a plurality of transmitting directions;
    an electromagnetic wave guiding device for guiding the test beam;
    a test machine to be loaded with a device under test (DUT) for controlling the DUT to receive the guided test beam from a plurality of receiving directions; and
    a controller electrically connected with the test machine and the antenna array for calculating an antenna radiation pattern of the DUT based on at least one power received from the plurality of receiving directions corresponding to the DUT and a transmitting power of the antenna array,
    wherein the electromagnetic wave guiding device includes:
    a first horn antenna array and a second horn antenna array arranged and focused around a first center and a second center, respectively; and
    a plurality of bending waveguides connected between the first horn antenna array and the second horn antenna array,
    wherein the test beam is sequentially transmitted with beamforming by the antenna array at the first center towards the first horn antenna array, and the test beam after being guided by the plurality of bending waveguides is received by the DUT capable of beamforming at the second center to implement an OTA beam test of the DUT.

2. The rapid OTA production line test platform of claim 1, further comprising a rotary motor connected to the DUT.

3. The rapid OTA production line test platform of claim 1, wherein if the antenna array sequentially transmits the test beam with beamforming towards the second horn antenna array from the second center, then the DUT receives the test beam at the first center.

4. The rapid OTA production line test platform of claim 1, wherein resolutions of the first horn antenna array and the second horn antenna array respectively depend on number of horn antennae in the first horn antenna array and the second horn antenna array, intervals between the horn antennae, distance between the horn antennae and the antenna array and distance between the horn antenna and the DUT.

5. The rapid OTA production line test platform of claim 1, wherein the plurality of bending waveguides are adapted to guide the beamforming of the antenna array to define angles of a receiving end, and the DUT is disposed at the receiving end.

6. The rapid OTA production line test platform of claim 1, further comprising a beamforming circuit connected to the antenna array and an electronic scanning probe with beamforming capability.

7. The rapid OTA production line test platform of claim 6, wherein the beamforming circuit is connected to a network analyzer, signal generator, signal analyzer or a baseband equipment.

8. The rapid OTA production line test platform of claim wherein the OTA beam test is a millimeter wave (mmWave) fifth generation (5G) mobile communication OTA beam test.

* * * * *